(12) United States Patent
Connor et al.

(10) Patent No.: US 10,141,623 B2
(45) Date of Patent: Nov. 27, 2018

(54) MULTI-LAYER PRINTED CIRCUIT BOARD HAVING FIRST AND SECOND COAXIAL VIAS COUPLED TO A CORE OF A DIELECTRIC WAVEGUIDE DISPOSED IN THE CIRCUIT BOARD

(71) Applicant: International Business Machines Corporation, Armonk, NY (US)

(72) Inventors: Samuel R. Connor, Research Triangle Park, NC (US); Jose A. Hejase, Austin, TX (US); Joseph Kuczynski, North Port, FL (US); Joshua C. Myers, Austin, TX (US); Junyan Tang, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 30 days.

(21) Appl. No.: 15/295,308

(22) Filed: Oct. 17, 2016

(65) Prior Publication Data

US 2018/0108971 A1    Apr. 19, 2018

(51) Int. Cl.
*H01P 5/08* (2006.01)
*H05K 1/02* (2006.01)
(Continued)

(52) U.S. Cl.
CPC .............. *H01P 5/087* (2013.01); *H01P 3/121* (2013.01); *H01P 3/16* (2013.01); *H01P 5/103* (2013.01);
(Continued)

(58) Field of Classification Search
CPC .......... H01P 5/103; H01P 3/121; H01P 3/122; H01P 3/14; H01P 11/001; H01P 11/002; H01P 11/006; H01P 5/087
(Continued)

(56) References Cited

U.S. PATENT DOCUMENTS 2,659,055 A * 11/1953 Cohn .................... H01P 5/103
                                                                333/26
5,263,111 A    11/1993 Nurse et al.
(Continued)

FOREIGN PATENT DOCUMENTS

WO    2008114580 A1    9/2008

OTHER PUBLICATIONS

Gomez-Tornero, et al.: "Control of Leaky-Mode Propagation and Radiation Properties in Hybrid Dielectric-Waveguide Printed-Circuit Technology: Experimental Results IEEE Transactions on Antennas and Propagation", 2006, vol. 54, Issue: 11, pp. 3383-3390.
(Continued)

*Primary Examiner* — Benny Lee
(74) *Attorney, Agent, or Firm* — Patterson + Sheridan, LLP

(57) ABSTRACT

Embodiments herein describe a high-speed communication channel in a PCB that includes a dielectric waveguide coupled at respective ends to coaxial vias. The dielectric waveguide includes a core and a cladding where the material of the core has a higher dielectric constant than the material of the cladding. Thus, electromagnetic signals propagating in the core are internally reflected at the interface between the core and cladding such that the electromagnetic signals are primary contained in the core. The coaxial vias include a center conductor and an outer conductor (or shield) which extend through one or more layers of the PCB. One of the coaxial vias radiates electromagnetic signals into the dielectric waveguide at a first end of the core while the other coaxial via receives the radiated signals at a second end of the core.

16 Claims, 13 Drawing Sheets

(51) Int. Cl.
 *H01P 3/16* (2006.01)
 *H01P 11/00* (2006.01)
 *H01P 5/103* (2006.01)
 *H01P 3/12* (2006.01)
 *H05K 1/11* (2006.01)

(52) U.S. Cl.
 CPC .......... *H01P 11/006* (2013.01); *H05K 1/0222* (2013.01); *H05K 1/0243* (2013.01); *H05K 1/113* (2013.01); *H05K 2201/0187* (2013.01); *H05K 2201/09618* (2013.01)

(58) Field of Classification Search
 USPC .................................................. 333/26, 239
 See application file for complete search history.

(56) References Cited

U.S. PATENT DOCUMENTS

| | | | |
|---|---|---|---|
| 5,982,255 A * | 11/1999 | Tanizaki et al. | ........ H01P 3/165 333/239 |
| 6,031,433 A | 2/2000 | Tanizaki et al. | |
| 6,706,546 B2 | 3/2004 | Yoshimura et al. | |
| 6,834,131 B2 | 12/2004 | Tourne | |
| 6,839,476 B2 | 1/2005 | Kim et al. | |
| 6,845,184 B1 | 1/2005 | Yoshimura et al. | |
| 6,885,788 B2 | 4/2005 | Iwaki et al. | |
| 6,919,508 B2 | 7/2005 | Forcier | |
| 6,996,305 B2 | 2/2006 | Kim et al. | |
| 7,024,086 B2 | 4/2006 | Tourne | |
| 8,111,954 B2 | 2/2012 | Koizumi et al. | |
| 8,188,805 B2 | 5/2012 | Nomura et al. | |
| 2005/0251994 A1 | 11/2005 | Yuasa | |
| 2008/0044127 A1 | 2/2008 | Leising et al. | |
| 2013/0104387 A1 | 5/2013 | Ma et al. | |
| 2013/0154759 A1 * | 6/2013 | Morita et al. | ........... H01P 3/081 333/26 |
| 2015/0295298 A1 * | 10/2015 | Payne et al. | ............. H01P 3/16 343/837 |

OTHER PUBLICATIONS

Yang, et al.: "A Cascaded Triplet SIW Bandpass Filter", Microwave Journal, Nov. 2012, vol. 55, Issue 11, p. 120.

H. Uchimura, et al.: "Development of a 'Laminated Waveguide'", IEEE Transactions on Microwave Theory and Techniques, vol. 46, Issue 12, Dec. 1998, pp. 2438-2443.

Mosso, et al.: "FR-4 Substrate Integrated Waveguide PCB at 20GHz", 2010 ANSYS South American Conference & ESSS Users Meeting, Oct. 2010, Atibaia, SP-Brazil.

\* cited by examiner

MULTI-LAYER PRINTED CIRCUIT BOARD HAVING FIRST AND SECOND COAXIAL VIAS COUPLED TO A CORE OF A DIELECTRIC WAVEGUIDE DISPOSED IN THE CIRCUIT BOARD

BACKGROUND

The present invention relates to a dielectric waveguide in a multi-layer printed circuit board (PCB).

Computing systems rely on high speed buses to transmit data between different components—e.g., processors, memory, accelerators, I/O devices, graphics cards, and the like. Differential signaling is primarily used for short high speed buses. In this technique, each signal line includes two wires which transmit opposite polarity signals. A receiver coupled to the two wires calculates the voltage difference between the wires to determine the data bit being transmitted. Using differential signaling rather than a single wire for each data bit significantly reduces the impact of noise and radiated emissions on the transmitted signal. However, as data speeds increase (e.g., greater than 25 Gb/s), the lengths at which a bus can effectively use differential signaling are reduced.

Fiber optics is another technique for transmitting data between computing devices at high speeds. Fiber optics can transmit signals at speeds above 100 Gb/s for much farther distances than a bus that uses differential signal. However, optical transmitters and receivers are expensive and require more space relative to the drivers and receivers used to perform differential signaling.

SUMMARY OF THE INVENTION

One embodiment of the present disclosure is a multi-layer printed circuit board (PCB) that includes a dielectric waveguide including a core and a cladding where the cladding is disposed on at least two sides of the core, and where a material of the core has a higher dielectric constant than a material of the cladding. The PCB includes a first coaxial via including a first center conductor and a first outer conductor surrounding the first center conductor, where the first center conductor extends at least partially into a first end of the core. The PCB includes a second coaxial via comprising a second center conductor and a second outer conductor surrounding the second center conductor, where the second center conductor extends at least partially into a second end of the core.

Another embodiment described herein is a communication system that includes a dielectric waveguide including a core and a cladding where the cladding is disposed on at least two sides of the core, and where a material of the core has a higher dielectric constant than a material of the cladding. The system includes a first coaxial via including a first center conductor and a first outer conductor surrounding the first center conductor where the first center conductor extends at least partially into a first end of the core. The system includes a second coaxial via including a second center conductor and a second outer conductor surrounding the second center conductor, where the second center conductor extends at least partially into a second end of the core.

Another embodiment described herein is a method of fabricating a PCB that includes forming a dielectric waveguide including a core and a cladding where the cladding is disposed on at least two sides of the core and where a material of the core has a higher dielectric constant than a material of the cladding. The method includes forming a first coaxial via comprising a first center conductor and a first outer conductor surrounding the first center conductor where the first center conductor extends at least partially into a first end of the core. The method includes forming a second coaxial via including a second center conductor and a second outer conductor surrounding the second center conductor where the second center conductor extends at least partially into a second end of the core.

BRIEF DESCRIPTION OF THE DRAWINGS

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION OF THE INVENTION

Embodiments herein describe a high-speed communication channel in a PCB that includes a dielectric waveguide coupled at respective ends to coaxial vias. The dielectric waveguide includes a core and a cladding where the material of the core has a higher dielectric constant than the material of the cladding. Thus, electromagnetic signals propagating in the core are internally reflected at the interface between the core and cladding such that the electromagnetic signals are primarily contained in the core. The coaxial vias include a center conductor and an outer conductor (or shield) which extend through one or more layers of the PCB. One of the coaxial vias radiates electromagnetic signals into the dielectric waveguide at a first end of the core while the other coaxial via receives the radiated signals at a second end of the core. For example, the center conductor extends into the core of the dielectric material and functions like an antenna to radiate the electromagnetic signal into the core. After traveling through the dielectric waveguide, the electromagnetic signal reaches the center conductor of another coaxial via which receives the signal. In one embodiment, the center conductors of the coaxial vias are bonded to respective integrated circuits (e.g., processors or ASICs) mounted on the PCB. The integrated circuits can use the coaxial vias and dielectric waveguide to transmit high speed data signals (e.g., greater than 70 Gb/s) between each other.

Figure 1:
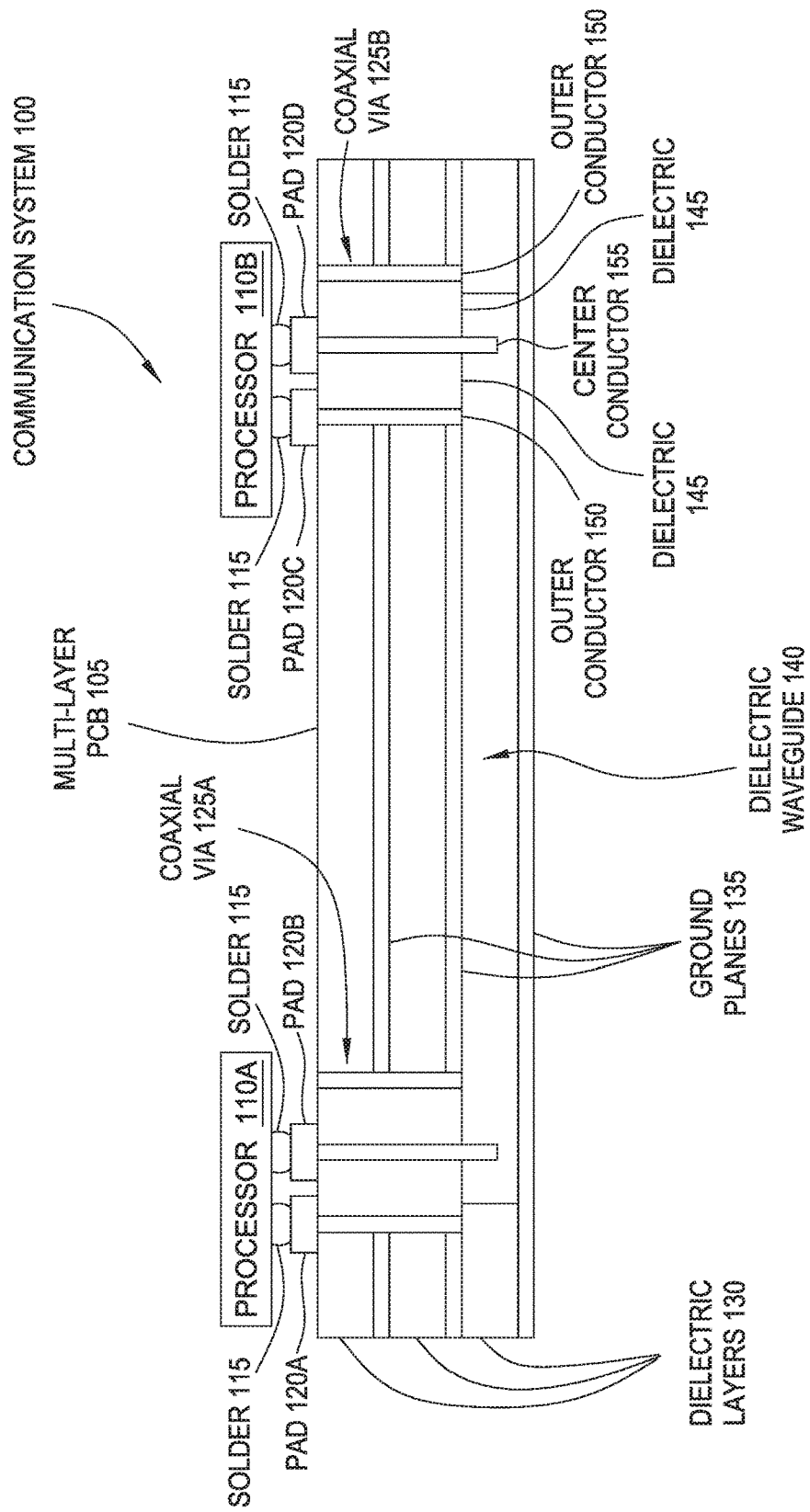
FIG. 1 illustrates a multi-layer PCB with a dielectric waveguide, according to one embodiment described herein.

FIG. 1 illustrates a communication system 100 that includes a multi-layer PCB 105 with a dielectric waveguide 140, according to one embodiment described herein. As shown, the PCB 105 includes multiple dielectric layers 130 that are separated by ground planes 135. The dielectric layers 130 can be any rigid insulative material that can provide support for the components mounted to the PCB 105. However, the various layers shown in FIG. 1 can form either a rigid PCB that is not intended to bend or curve or a flexible PCB (i.e., a flex PCB) in which case the dielectric layers 130 are not rigid. The ground planes 135 can be conductive layers—e.g., copper sheets.

In this embodiment, respective processors 110A and 110B are coupled by solder 115 (e.g., solder bumps) to pads 120A, 120B, 120C, and 120D on an outer surface of the PCB 105. The solder 115 may be part of a ball grid array that couples multiple I/O ports in the processors 110A and 110B to respective pads 120A, 120B, 120C, and 120D in the PCB 105. Although FIG. 1 illustrates that each processor 110A and 110B has two solder connections to the PCB 105, the ball grid array can include any number of connections. For example, the dielectric waveguide 140 may be only one of a plurality of communication channels between the processors 110A and 110B. That is, the pads 120A, 120B, 120C, and 120D, coaxial vias 125A and 125B and dielectric waveguide 140 may be repeated in the PCB 105 to provide separate high-speed communication channels between the processors 110A and 110B. These communication channels may collectively form a high-speed bus.

The coaxial vias 125A and 125B each includes a center conductor 155 electrically insulated from an outer conductor 150 (e.g., a shield) by a dielectric 145. As shown, the center conductor 155 is coupled to a respective pad 120B and 120D to receive electromagnetic signals from, or transmit electromagnetic signals to, one of the processors 110A and 110B. For example, the processor 110A may use the solder 115 and pad 120B to drive an electromagnetic data signal onto the center conductor 155 of coaxial via 125A. As described in more detail below, the center conductor 155 introduces the electromagnetic data signal into the dielectric waveguide 140 which guides the signal to center conductor 155 of the coaxial via 125B. Using the pad 120D and another solder connection 115, the electromagnetic data signal is received by the processor 110B. While the center conductor 155 is used to transmit the data signal, the outer conductor 150 is grounded. In this example, the outer conductors 150 in each of the coaxial vias 125A and 125B are coupled to a ground port via the pads 120A and 120C. Moreover, the outer conductors 150 are coupled to multiple ground planes 135. However, in other embodiments, the outer conductors 150 are coupled to the ground planes 135 but not to the processors 110A and 110B through the pads 120A, 120B, 120C, and 120D.

As shown, the outer conductor 150 surrounds the center conductor 155 in each of the coaxial vias 125A and 125B. In one embodiment, both the outer conductor 150 and the center conductor 155 are cylindrical shape but can be any number of shapes (e.g., elliptical, rectangular, etc.). The outer conductor 150 forms an annular ring through which the center conductor 155 extends. However, the outer conductor 150 does not completely surround the center conductor 155 since the top portion of the center conductor 155 couples to the pad 120D and the bottom portion extends into the dielectric waveguide 140.

In one embodiment, the electromagnetic signals transmitted using the communication system 100 have wavelengths that are greater than the wavelengths of electromagnetic signals in the visible light spectrum or infrared spectrum. That is, the wavelengths of the electromagnetic signals used in system 100 may be greater than 1000 microns. Because of the inverse relationship between wavelength and frequency, the frequencies of the electromagnetic signals used in communication system 100 may be less than the frequencies of the infrared spectrum—e.g., less than 300 GHz. By using frequencies less than infrared or visible light, expensive and bulky optical transmitters and receivers can be avoided.

Although FIG. 1 illustrates communication between two processors 110A and 110B, the multi-layer PCB 105 can be used to facilitate high speed communication between many different computing devices. For example, the PCB 105 may be part of a motherboard in a computing system that couples processors to each other as well as other periphery devices such as a graphics card, main memory, network controller, accelerators, and the like. Each of these connections may be facilitated by using one or more of the communication channels established by the dielectric waveguide 140 and the pair of coaxial vias 125A and 125B.

Figure 2:
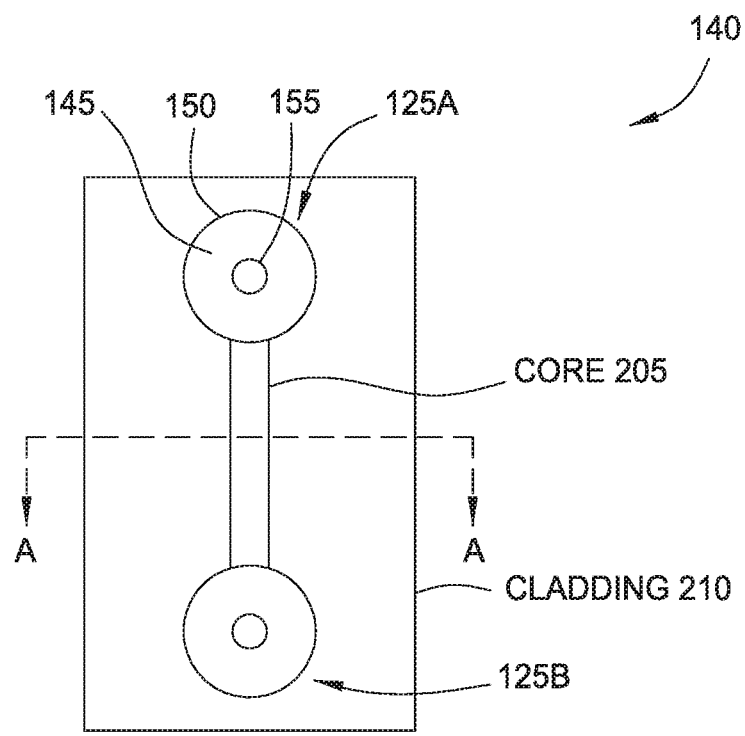
FIG. 2 illustrates a dielectric waveguide coupled to coaxial vias, according to one embodiment described herein.

FIG. 2 illustrates a dielectric waveguide 140 coupled to coaxial vias 125A and 125B, according to one embodiment described herein. FIG. 2 illustrates a top down view of the dielectric waveguide 140 where any dielectric layer or grounding planes above the waveguide 140 have been removed. As shown, the dielectric waveguide 140 includes a core 205 and cladding 210. The dielectric material of the core 205 has a higher dielectric constant than the dielectric material of the cladding 210. In one embodiment, the core 205 and cladding 210 directly contact such that there is no air gap between the two materials. Thus, electromagnetic signals propagating in the core 205 are reflected at the interface between the core 205 and cladding 210 such that the power of the electromagnetic signal is contained primarily within the core 205 (although some leakage may occur).

Any dielectric material can be used for the core 205 and the cladding 210 so long as the dielectric constants have the relationship described above. Further, if used in a multi-layer PCB, the dielectric material may have sufficient rigidity to provide support for the other layers in the PCB as well any components or devices mounted onto the PCB. Furthermore, the same dielectric material used for either the core 205 or the cladding 210 can also be used to form the other dielectric layers in the multi-layer PCB—e.g., layers 130 shown in FIG. 1.

The center conductor 155 in FIG. 2 extends through the outer conductor 150 to transmit electromagnetic signals into or out of the page. For example, the center conductor 155 in coaxial via 125A may transmit the electromagnetic signals into the core 205. Because of the difference in dielectric constants between the materials of the core 205 and the cladding 210, much of the power of the electromagnetic signal is contained within the core 205 as the signal travels down the core 205 to the coaxial via 125B. Once received by the center conductor 155 in coaxial via 125B, the center conductor 155 transmits the signal through the coaxial via 125B to a component or device coupled to the via 125B.

Figure 3:
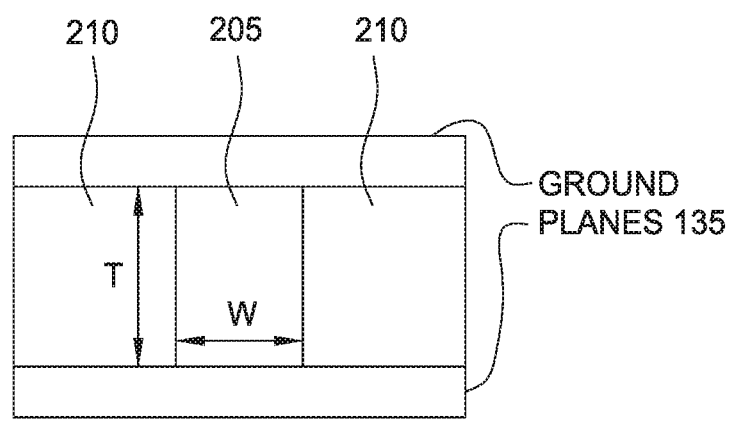
FIG. 3 is a cross section of the dielectric waveguide in FIG. 2, according to one embodiment described herein.

FIG. 3 is a cross section of the dielectric waveguide 140 along the dotted lines A-A in FIG. 2, according to one embodiment described herein. As shown, the core 205 and cladding 210 are sandwiched between a pair of ground planes 135. The material of the core 205 directly contacts the material of the cladding 210 such that there is no air gap between the materials. Similarly, the core 205 and cladding 210 directly contact the conductive material of the ground planes 135 (e.g., copper foil).

In one embodiment, the thickness (T) of the core 205 and cladding is between 40-80 mm, and in one embodiment, is between 50-70 mm. The width (W) of the core 205 may be between 0.1 to 2 mm, or in another example, between 0.2 and 0.5 mm. The specific width and thickness of the core 205 can vary depending on the frequency or wavelength of the electromagnetic signal transmitted in the dielectric waveguide. For example, the core 205 may have a wider width if used to transmit signals with larger wavelengths.

Figure 4:
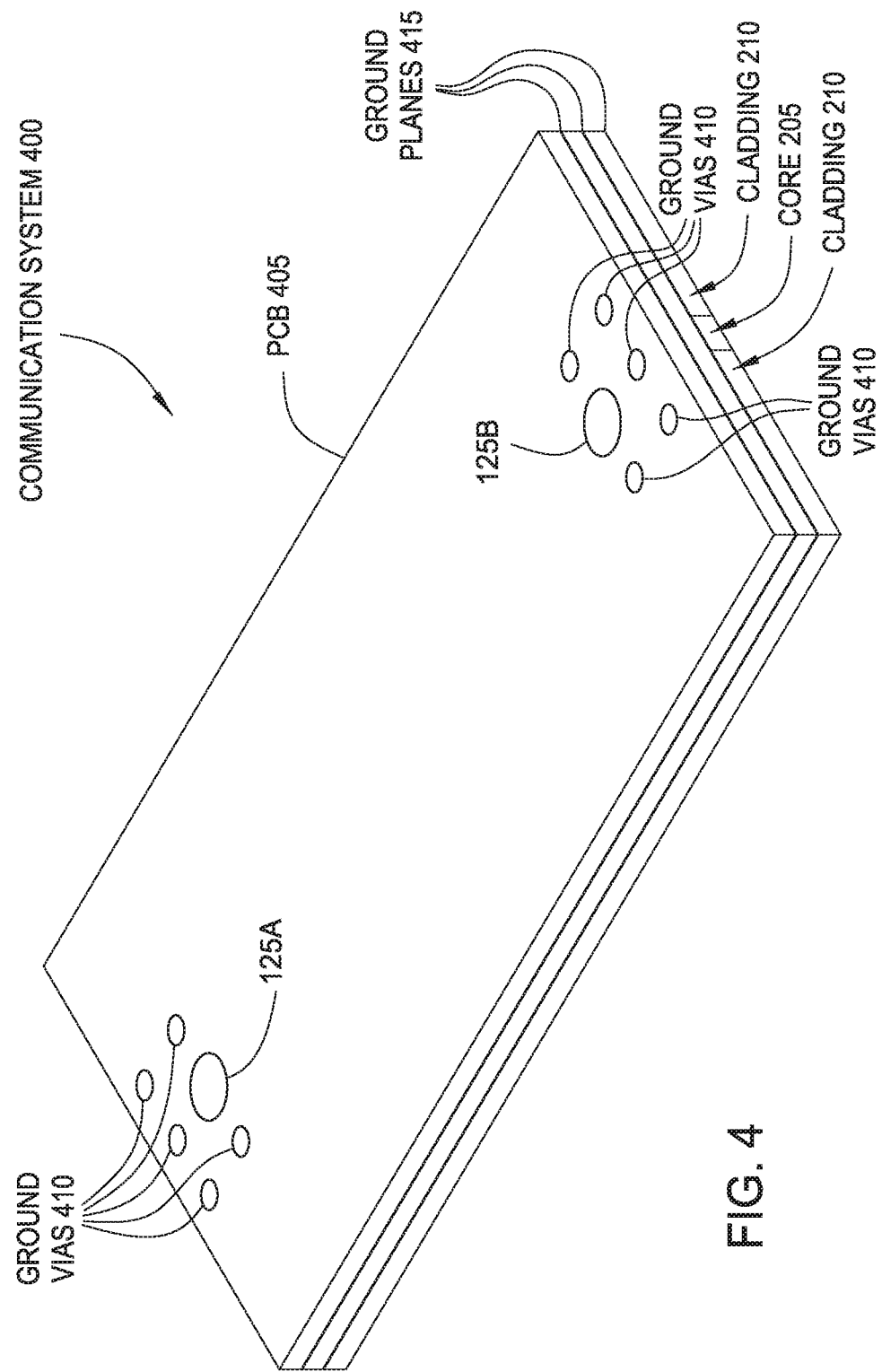
FIG. 4 illustrates coaxial vias surrounded at least partially by ground vias, according to one embodiment described herein.

FIG. 4 illustrates coaxial vias 125A and 125B enclosed by ground vias 410, according to one embodiment described herein. The communication system 400 in FIG. 4 illustrates surrounding the circumference of the coaxial vias 125A and 125B on three sides by the ground vias 410. As described in more detail below, the ground vias 410 focus or force the electromagnetic signals radiated by the center conductors of the coaxial vias 125A and 125B in a desired direction along the core 205. In one embodiment, the ground vias 410 are solid cylinders of conductive material (e.g., copper) and are electrically connected to ground planes 415. In one embodiment, the ground vias 410 extend through at least two of the dielectric layers and the ground planes 415 in the PCB 405. Moreover, the ground vias 410 can also be electrically connected to the outer conductors of the coaxial vias 125A and 125B such that the ground vias 410, the outer conductors, and the ground planes 415 all share the same voltage—e.g., ground or a reference voltage —during operation.

The bottom layer of the PCB 405 includes the core 205 and the cladding 210. In one embodiment, a ground plane 415 is disposed on the bottom surface of the core 205 and cladding 210 and is coupled to the ground vias 410. Here, the material of the cladding 210 takes up the entire bottom layer of the PCB 405 except for the portion that includes the core 205. However, in another embodiment, the bottom layer can include a third material where the cladding 210 is disposed between the third dielectric material and the core 205. For example, the third material may be more rigid than either the core 205 or the cladding 210, and thus, is added in the bottom layer to improve the structural integrity of the PCB 405.

Figure 5:
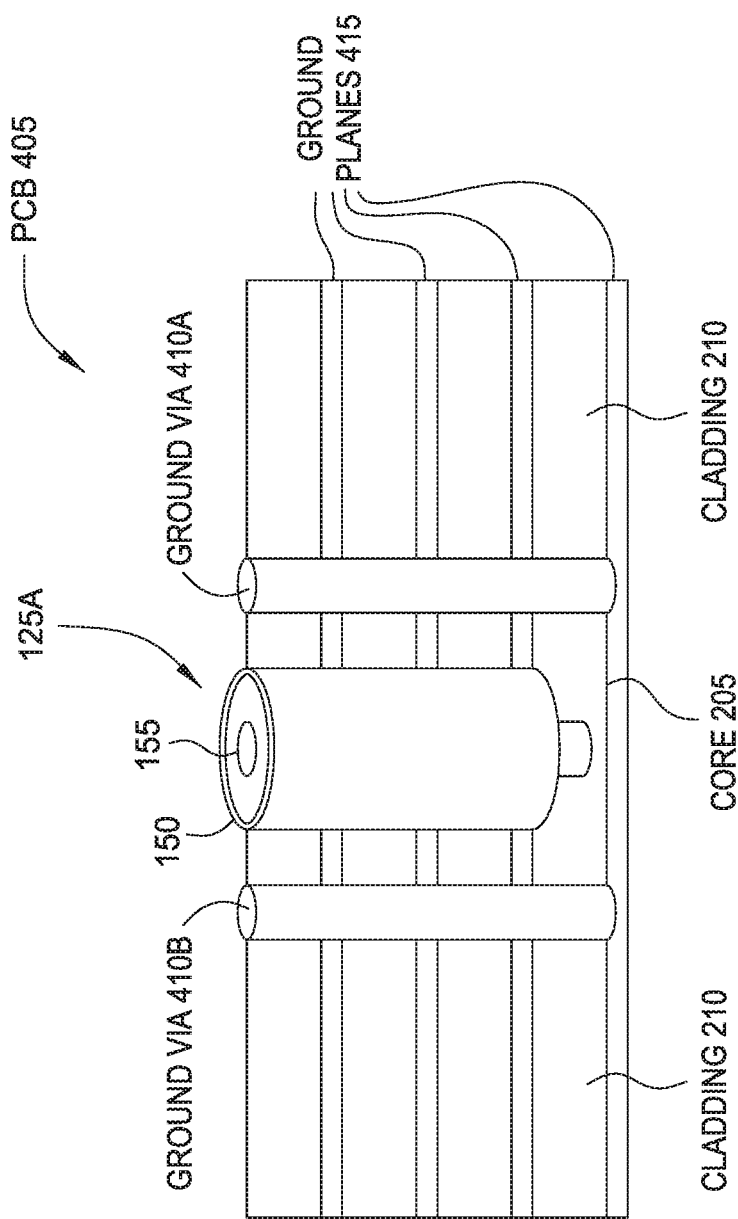
FIG. 5 illustrates a side view of a coaxial via and ground vias, according to one embodiment described herein.

FIG. 5 illustrates a side view of the coaxial via 125A and ground vias 410A and 410B in FIG. 4, according to one embodiment described herein. In this view, only two of the ground vias 410A and 410B are shown—i.e., ground vias 410A and 410B—which are disposed on opposite sides of the coaxial via 125A. As shown, the ground vias 410A and 410B extend through all the dielectric layers and the ground planes 415 as well as the bottom layer of the PCB 405 which includes the core 205 and cladding 210. The ground vias 410A and 410B are electrically coupled to the ground planes 415 which are in turn coupled to the outer conductor 150 of the coaxial via 125A. However, unlike the ground vias 410A and 410B, the outer conductor 150 does not extend through the bottom layer of the PCB 405. Instead, the outer conductor 150 extends from a top surface of the PCB 405 to only the bottom ground plane 415 but not into the core 205 or cladding 210. In another embodiment, the coaxial via extends from a bottom surface of the PCB 405 and extends to the top ground plane.

The center conductor 155 extends from the top surface into the core 205. That is, a bottom end of the center conductor 155 extends below the bottom end of the outer conductor 150 into the core 205. However, in FIG. 5, the center conductor 155 does not extend all the way through the core 205 but only partially into the core 205. Because the outer conductor 150 does not shield the center conductor 155 in the core 205, the bottom portion of the center conductor 155 functions as a monopole antenna that radiates the electromagnetic signal into the core 205. In one embodiment, the center conductor 155 has an omnidirectional radiation pattern where the power of the electromagnetic signal radiates in all azimuthal directions perpendicular to the antenna but the radiated power varies with elevation angle. As the elevation angle increases, the radiation power decreases to zero.

Because of this omnidirectional radiation pattern, the center conductor 155 radiates the electromagnetic signal in all directions along the core 205. However, as shown in FIG. 4, in order to the reach the other coaxial via at the opposite end of the core 205, the electromagnetic signals should propagate along the length of the core 205. The radiation pattern of the center conductor 155, however, may transmit the electromagnetic signals equally along the azimuthal plane that is parallel with the ground planes 415. The ground vias 410 direct the electromagnetic signal radiated in an undesired direction by the center conductor 155 to the desired direction—e.g., along the length of the core 205 towards the other coaxial via. Because the ground vias 410A and 410B extend into the bottom layer of the PCB 405 and surround the circumference of the via 125A on three sides, the ground vias 410 can help to redirect the electromagnetic signals emitted towards the ground vias 410 to a direction that is more aligned with an axis of the core 205 that extends between the two coaxial vias. Even if the redirected electromagnetic signals are not perfectly aligned with this axis, the signals that strike the interface between the core 205 and the cladding 210 are reflected back into the core 205 thereby containing the majority of the electromagnetic signal in the core 205 as the signal propagates to the opposite end of the core 205.

In one embodiment, the distance between neighboring ground vias (e.g., the pitch) is between 0.5 to 1 mm. However, this distance may vary depending on the wavelength of the electromagnetic signals being transmitted in the dielectric waveguide. As the wavelength increases, the pitch of the ground vias 410A and 410B may be increased, and vice versa. Moreover, although the ground vias 410A and 410B are illustrated in FIG. 5 as through vias that extend from the top surface to the bottom surface of the PCB 405, in another embodiment, the vias 410A and 410B are buried or micro vias where one or both ends of the vias 410A and 410B are not exposed on an external surface of the PCB 405. For example, unlike the outer conductor 150 and the center conductor 155, the ground vias 410A and 410B may not be connected to a ball grid array using pads to a component mounted on the PCB 405.

The center conductor 155 of the coaxial via 125A is a solid cylinder formed using a conductive material (e.g., copper). However, the center conductor 155 does not need to be a solid cylinder and in other embodiments may be hollow. The outer conductor 150 is also a cylinder but includes an aperture in which the center conductor 155 and dielectric material are disposed. In one embodiment, the diameter of the center conductor 155 ranges between 0.1 to 0.4 mm while the diameter of the outer conductor ranges between 0.5 to 1 mm. The height of the coaxial via 125A varies depending on the number of dielectric layers in the PCB 405 as well as the location of the core 205 and the cladding 210 in the PCB 405. Although FIG. 5 illustrates disposing the core 205 and cladding 210 in the bottommost layer of the PCB 405, in other embodiments, the dielectric waveguide may be disposed in a middle layer of the PCB 405 sandwiched between other dielectric layers. Moreover, as shown, a ground plane 415 is disposed on the bottom surface of the core 205 and cladding 210.

Figure 6:
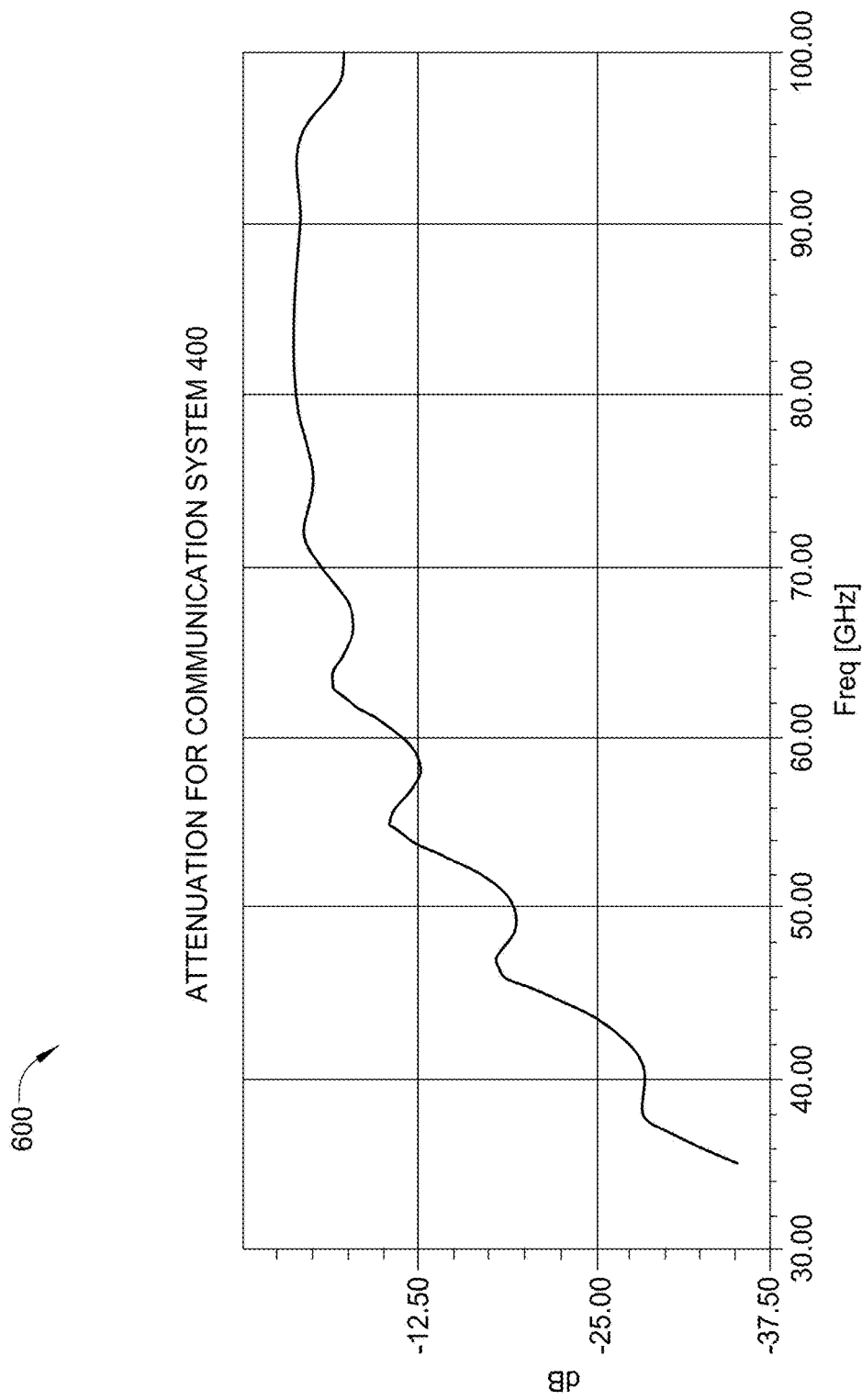
FIG. 6 is a chart illustrating the attenuation of electromagnetic signals transmitted using the communication system shown in FIG. 4, according to one embodiment described herein.

FIG. 6 is a chart 600 illustrating the attenuation of electromagnetic signals transmitted using the communication system 400 shown in FIG. 4, according to one embodiment described herein. Specifically, the chart 600 illustrates the attenuation in dB of signals at different frequencies—i.e., between 30-100 GHz. At signals above 70 GHz, the attenuation is between 3-5 dB. The results illustrated in the chart 600 are obtained using the dielectric waveguide shown in FIG. 4 with a length of 12.5 mm between the two coaxial vias. The attenuation includes loss from two primary sources: the coupling loss between the coaxial vias and the core and the loss of the dielectric waveguide as signals leak out of the core into the cladding. The chart 600 illustrates that very high speed signals—e.g., greater than 70 GHz— can be successfully coupled into and out of a dielectric waveguide using the coaxial vias described above.

Figure 7:
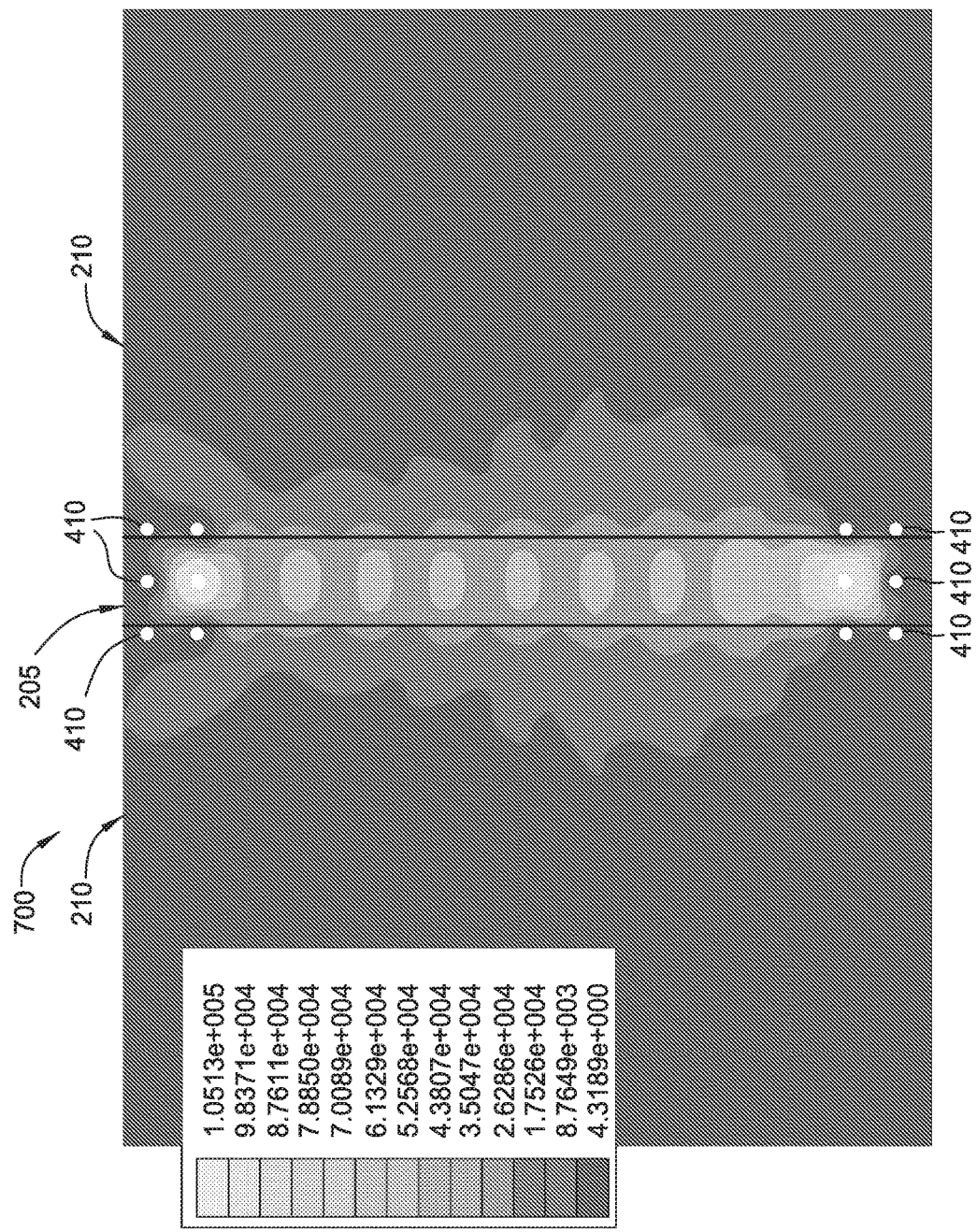
FIG. 7 illustrates the electric field strength of an electromagnetic signal transmitted using the communication system shown in FIG. 4, according to one embodiment described herein.

FIG. 7 is a graph 700 that illustrates the electric field strength of an electromagnetic signal transmitted using the communication system shown in FIG. 4, according to one embodiment described herein. The key illustrates different shades of grey that correspond to a varying field strength of an electromagnetic signal transmitted in the dielectric waveguide. Specifically, the darker shades correspond to lower field strength, while the lighter shades correspond to higher field strengths. In this example, the electromagnetic signals are radiated by the bottom coaxial via to the top coaxial via. Although the signals radiate in an omnidirectional pattern (along the illustrated plane), the ground vias 410 surrounding the three sides of the coaxial via focus most of the electromagnetic signal along the core 205. That is, the ground vias 410 reduce the amount of coupling loss between the coaxial vias and the core 205 by focusing the electromagnetic signal along a direction that is more aligned with an axis in the core 205 extending between the two coaxial vias.

Moreover, FIG. 7 illustrates that some of the electromagnetic signal leaks out of the core 205 into the cladding 210 as the signal propagates between the coaxial vias. That is, in this example, the signal is not reflected perfectly as the signal strikes the interface between the core 205 and cladding 210. While most of the field strength (or power) of the signal is contained within the core 205, some of the signal leaks into the cladding thereby increasing the loss of the waveguide. However, as illustrated by chart 600, the total loss of the coaxial vias and the dielectric waveguide for signals about 70 GHz is between 3-5 dB.

When the electromagnetic signals reach the upper coaxial via in FIG. 7, some of the electromagnetic signal leaks out of the core 205 around the ground vias 410. That is, some of the electromagnetic signal is reflected away from the upper coaxial via by the ground vias closest to the bottom coaxial via. Thus, the efficiency of the communication system can be further improved if the received electromagnetic signals are better focused to the upper coaxial via.

Figure 8A:
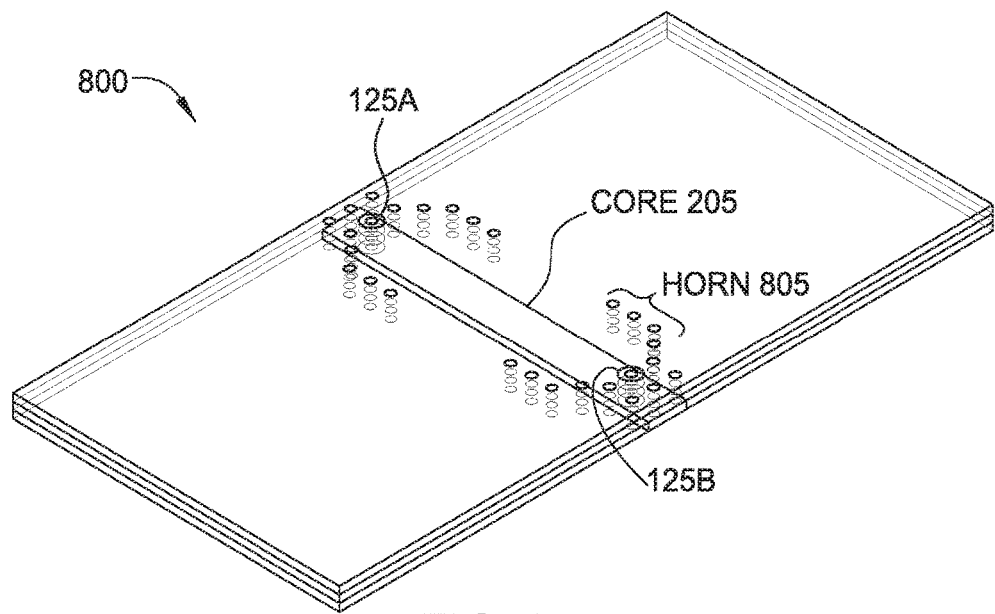
FIGS. 8A and 8B illustrate forming ground vias in a horn shape between two coaxial vias, according to one embodiment described herein.
Figure 8B:
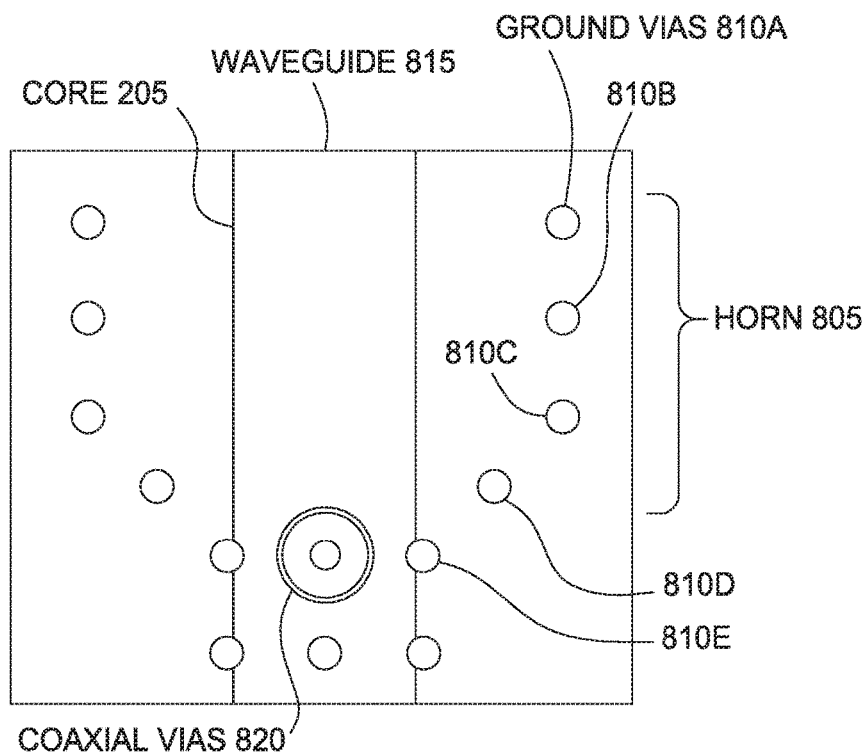

FIGS. 8A and 8B illustrate forming ground vias in a horn shape between two coaxial vias, according to one embodiment described herein. In FIG. 8A, additional ground vias are added to the PCB 800 relative to PCB 405 in FIG. 4 to form a horn 805. That is, FIG. 8A includes the same ground vias illustrated in FIG. 4 and also includes additional ground vias that flare out in a direction extending from the coaxial vias to form the horn 805. The top view in FIG. 8B illustrates that ground vias 810C, 810D and 810E extend away from the coaxial via 820 at an angle of 45 degrees. That is, the ground vias 810C-810E forming the horn flare out (i.e., the width of the horn 805 increases) when moving from the coaxial via 820 to the coaxial via at the opposite end of the core. However, the angle at which the ground vias 810C-810E extend away from the coaxial via 820 can vary depending on the wavelength of the electromagnetic signal. For signals with greater wavelengths, the more the signal spreads out in the core 205. To compensate, widening the horn 805 by increasing the angle relative to a center axis of the waveguide 815 can improve the ability of the horn 805 to prevent leakage. Moreover, widening the angle may be preferred for lower frequencies where wavelengths of the electromagnetic signals are longer.

The ground vias 810A, 810B and 810C extend in a direction parallel with the waveguide 815. The pitch of the ground vias 810A-810D forming the horn 805 may be the same as the pitch of the ground vias 410A and 410B shown in FIG. 4—e.g., 0.5 to 1 mm—which can vary depending on the wavelength of the electromagnetic signals transmitted in the waveguide 815. Generally, the horn 805 helps to focus the electromagnetic signals propagating through the waveguide 815 on a receiving coaxial via 820 thereby mitigating the coupling loss shown in FIG. 7, where the received electromagnetic signals spread out near the upper coaxial via.

Figure 9:
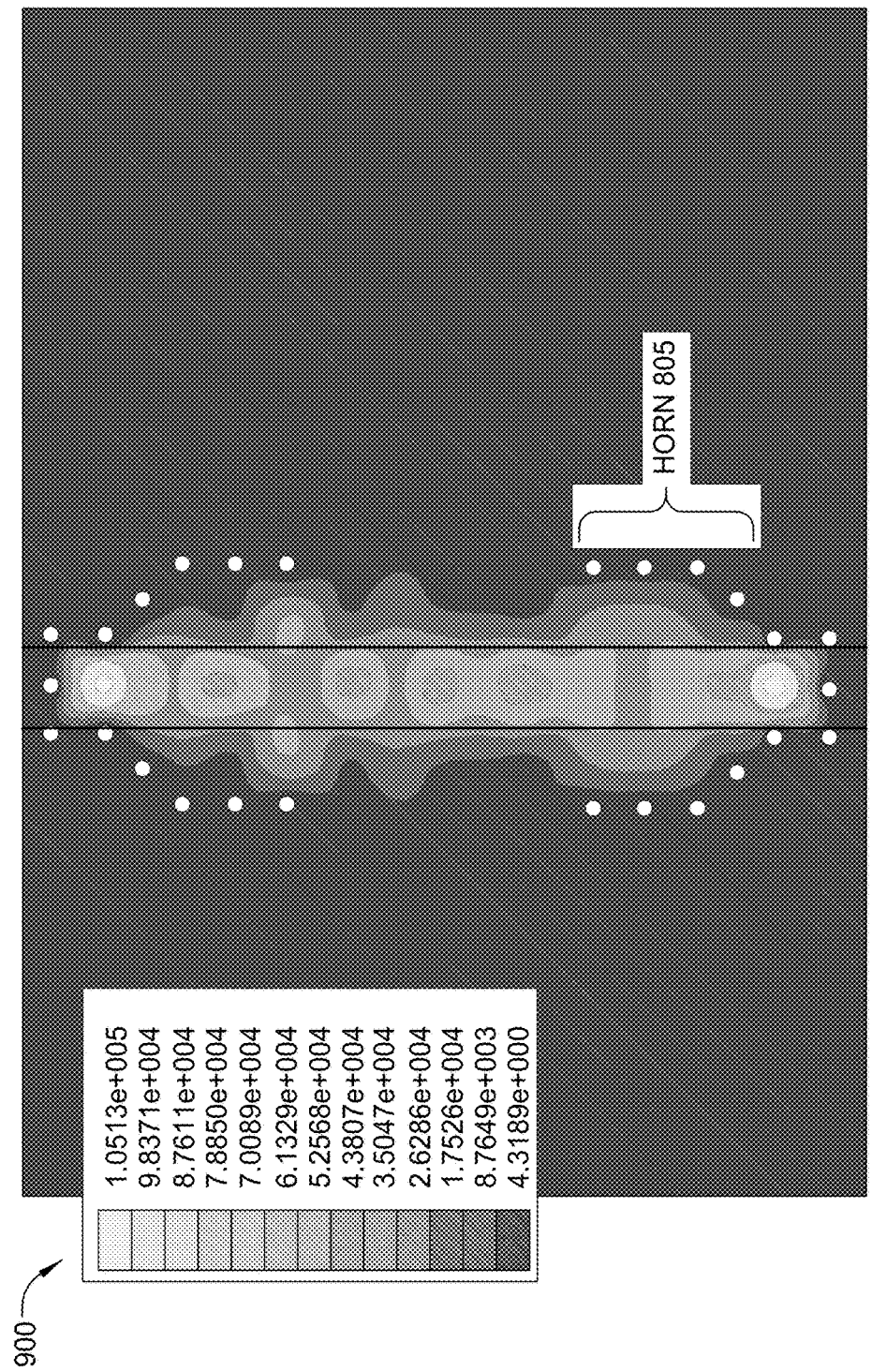
FIG. 9 illustrates the electric field strength of an electromagnetic signal transmitted using the communication system shown in FIGS. 8A and 8B, according to one embodiment described herein.

FIG. 9 illustrates the electric field strength according to a scale 900 of an electromagnetic signal transmitted using the communication system shown in FIGS. 8A and 8B which is the attenuation of a waveguide with a horn that has a 12.5 mm length, according to one embodiment described herein. The horn 805 focuses the received electromagnetic signals onto a corresponding coaxial via thereby reducing the amount of the signal that leaks into the cladding. Moreover, in addition to focusing electromagnetic signals towards a receiving coaxial via, the horns 805 may focus electromagnetic signals into the core 205 illustrated in FIG. 8B when radiated from a coaxial via into the core. Put differently, the horn 805 can minimize the amount of signal that leaks into the cladding when transmitting the signal into the core.

Figure 10:
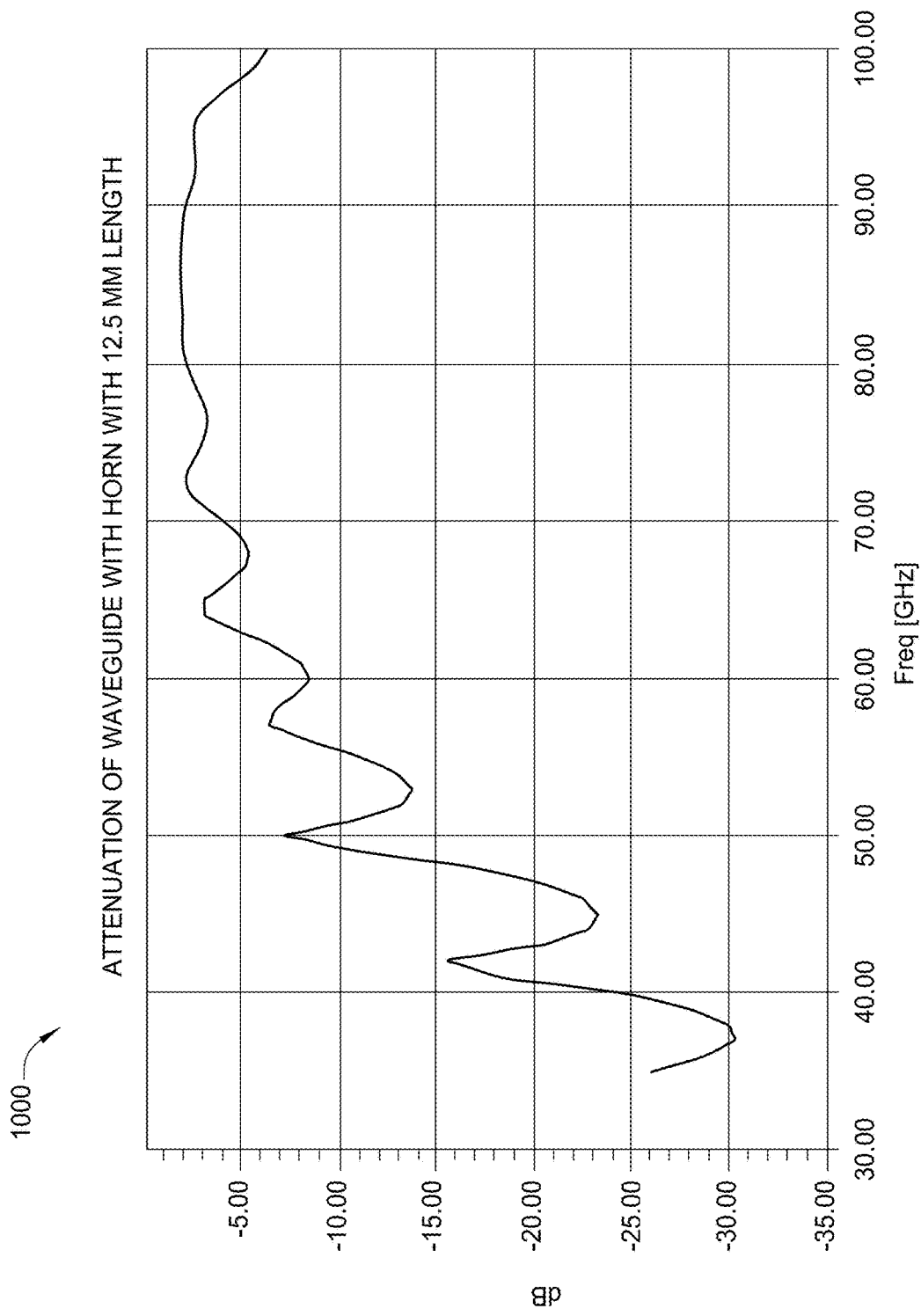
FIG. 10 is a chart illustrating the attenuation of electromagnetic signals transmitted using the communication system shown in FIGS. 8A and 8B with a first length, according to one embodiment described herein.

FIG. 10 is a chart 1000 illustrating the attenuation of electromagnetic signals transmitted using the communication system shown in FIGS. 8A and 8B i.e., the attenuation of a waveguide with a horn with a 12.5 mm length, according to one embodiment described herein. Specifically, the chart 1000 illustrates the attenuation in dB of signals at different frequencies—i.e., between 30-100 GHz—of a dielectric waveguide with a length of 12.5 mm which uses the horn 805. At signals between 70 GHz and 98 GHz, the attenuation is less than 5 dB. Specifically, at 84 GHz, the attenuation is 1.79 dB. Using the horns, the transmission efficiency improved from a −3.6 dB loss at 84 GHZ to a −1.79 dB loss.

Figure 11:
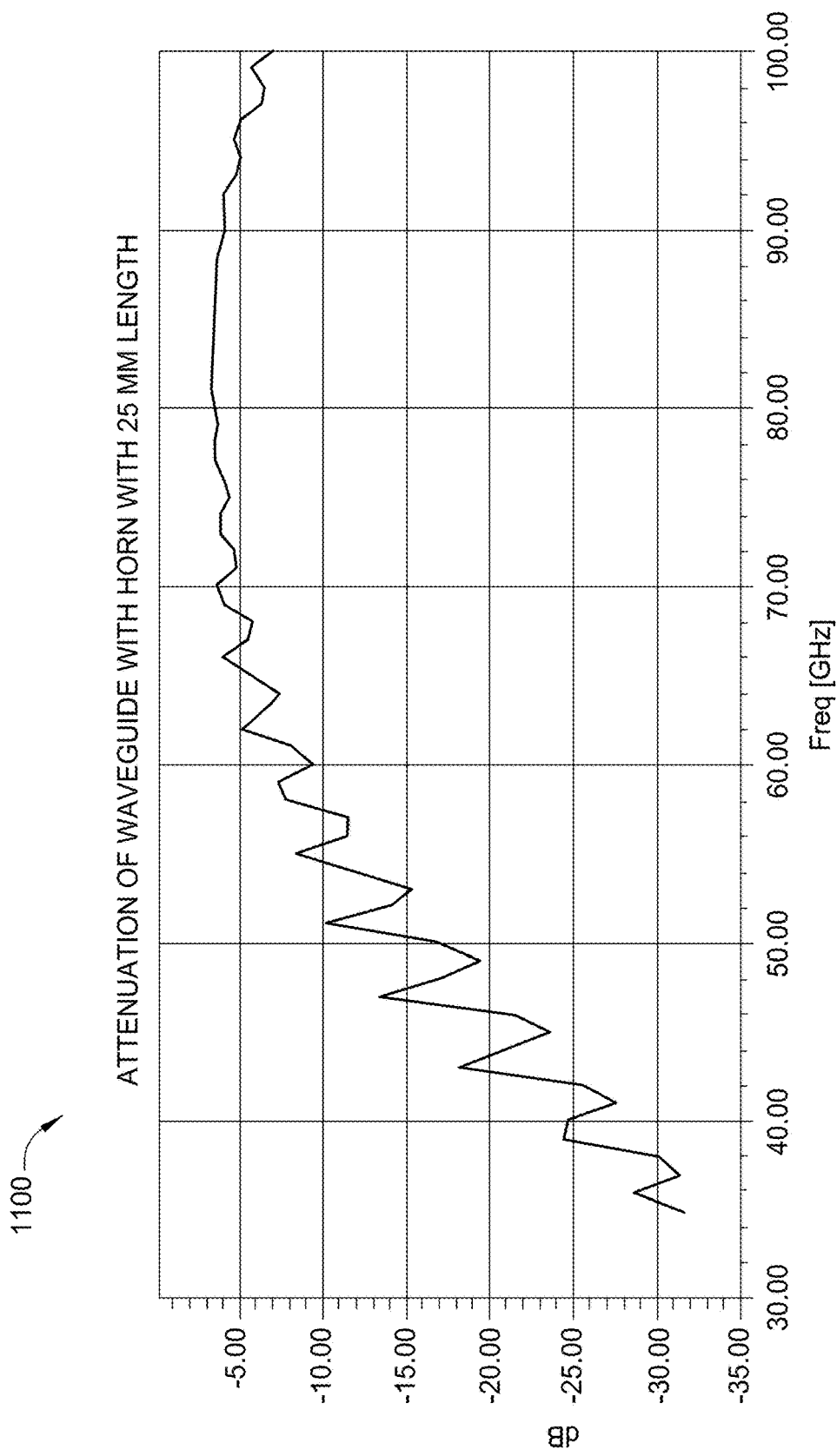
FIG. 11 is a chart illustrating the attenuation of electromagnetic signals transmitted using the communication system shown in FIGS. 8A and 8B with a second length, according to one embodiment described herein.

FIG. 11 is a chart 1100 illustrating the attenuation in dB of electromagnetic signals transmitted using the dielectric waveguide shown in FIGS. 8A and 8B, according to one embodiment described herein. Here, the length of the dielectric waveguide is 25 mm, i.e., doubled relative to the waveguide tested in chart 1000. As shown, the loss from the coaxial vias and the dielectric waveguide is approximately 3.202 dB at 84 GHz. Moreover, the loss attributable to coupling loss between the coaxial vias and the dielectric waveguide is approximately 0.4 dB (0.2 dB per coaxial via). Thus, the coupling loss due to using the coaxial vias is quite small indicating that the coaxial vias are excellent structures for transmitting and receiving high speed electromagnetic signals using the dielectric waveguides.

The signal attenuation due to signals leaking from the core into the cladding can be improved by optimizing the dimensions of the core for the specific frequency or wavelength of the electromagnetic signal being propagated in the core. That is, once the designer determines the frequency or frequencies of the electromagnetic signals used in the communication system, the dimensions of the core and cladding can be optimized for that specific frequency or range of frequencies which reduces leakage from the core to the cladding and reduces the attenuation.

Figure 12A:
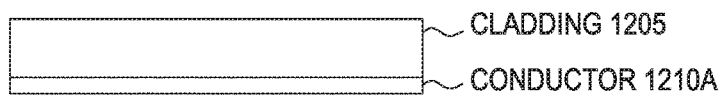
FIGS. 12A-12E illustrate forming a multi-layer PCB with a dielectric waveguide, according to one embodiment described herein.

FIGS. 12A-12E illustrates forming a multi-layer PCB with a dielectric waveguide, according to one embodiment described herein. FIG. 12A illustrates a cladding 1205 disposed onto a conductor 1210A. In one embodiment, the material of the cladding 1205 is a permanent photoresist that is applied to the conductor 1210A (e.g., copper foil). Dry film or liquid photoresist may be applied using a corresponding lamination or deposition technique to form the cladding 1205 on the conductor 1210A.

Figure 12B:
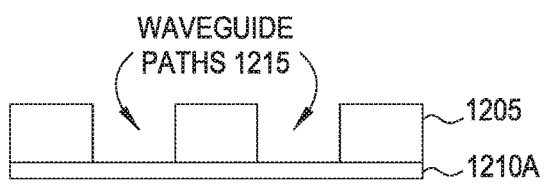

FIG. 12B illustrates patterning and removing the cladding 1205 to form waveguide paths 1215. For example, the photoresist material of the cladding 1205 may be exposed and developed to create the waveguide paths 1215.

Figure 12C:
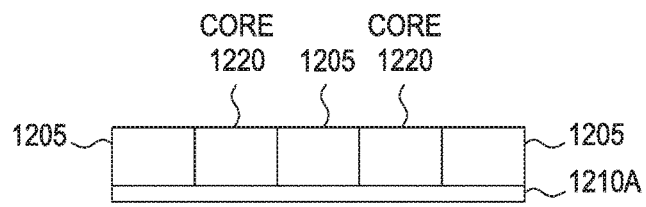

FIG. 12C illustrates applying the material of the core 1220 in the waveguide paths 1215 formed in FIG. 12B. In one embodiment, the material of the core 1220 is heated to remove solvent and the top surface is planarized to ensure the core 1220 and cladding 1205 are at equal heights. In one embodiment, the material of the core 1220 is a photoresist that has a higher dielectric constant than the photoresist used for the cladding 1205. In another example, the material of the core 1220 can be a dielectric material that is sputtered or deposited into the waveguide paths.

Figure 12D:
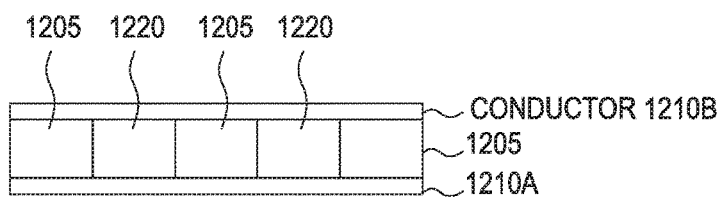

FIG. 12D illustrates forming a second conductor 1210B on the core 1220 and cladding 1205. In one embodiment, the second conductor 1210B is a copper foil that is laminated onto the planarized top surface of the core 1220 and cladding 1205. The thickness and width of the core 1220 and cladding 1205 can vary as described above. The thickness of the conductors 1210A and 1210B can range between 0.1 to 0.5 mm.

As shown in FIG. 12D, the PCB has multiple cores 1220, and thus, multiple dielectric waveguides which can be coupled to respective pairs of coaxial vias. The multiple dielectric waveguides may be used as parallel channels in the same bus—e.g., different channels for transmitting data between two processors in parallel—or separate communication links for different sets of components.

Figure 12E:
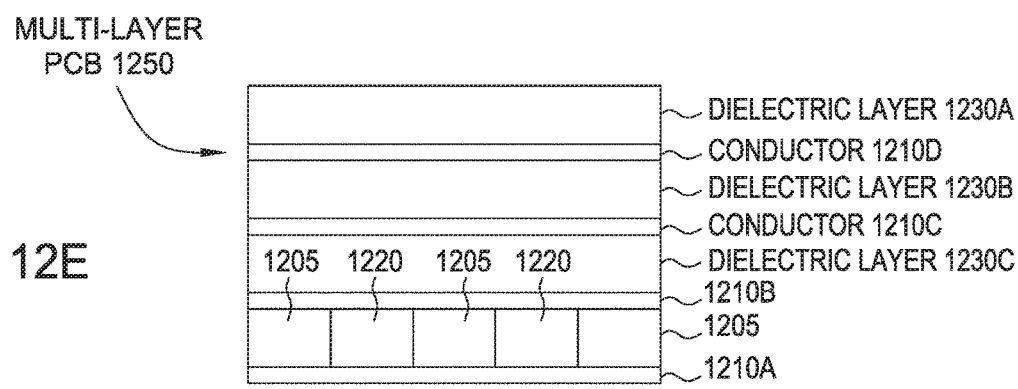

FIG. 12E illustrates forming multiple dielectric layers 1230A, 1230B and 1230C and conductors 1210C and 1210D onto the structure shown in FIG. 12D to form a multi-layer PCB 1250. Although the layer containing the cores 1220 and cladding 1205 is the bottom layer of the PCB 1250, in other embodiments, these components may be formed in intermediate layers of the PCB 1250.

Figure 13A:
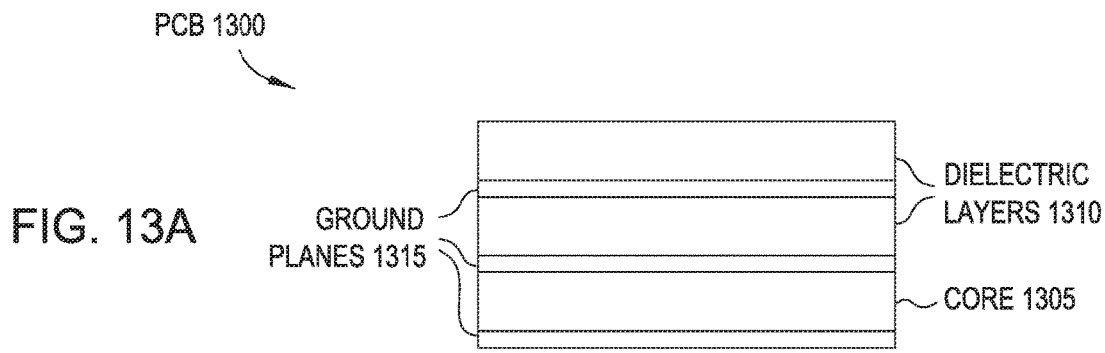
FIGS. 13A-13H illustrate forming a coaxial via in a multi-layer PCB, according to one embodiment described herein.

FIGS. 13A-13H illustrate forming a coaxial via in a multi-layer PCB, according to one embodiment described herein. FIG. 13A illustrates a cross section view of multi-layer PCB 1300. Specifically, the cross section is taken along the length of the core 1305, and thus, does not illustrate the cladding material which may be disposed on the sides of the core 1305. In this embodiment, the core 1305 is sandwiched between two ground planes 1315 and can be formed using the process illustrated in FIGS. 12A-12E.

Figure 13B:
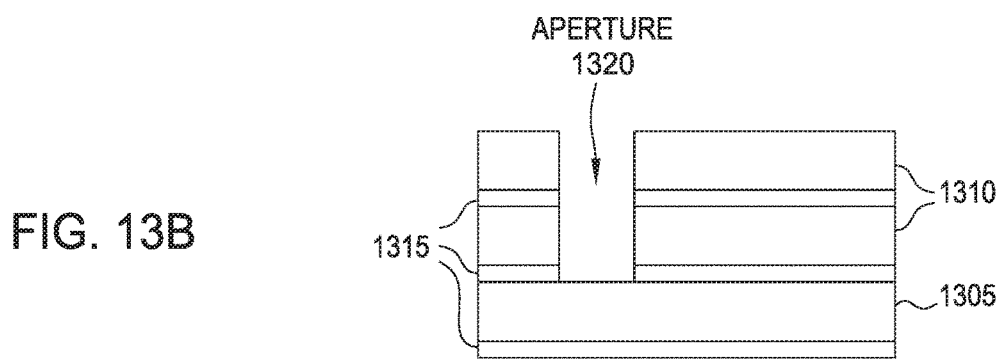

FIG. 13B illustrates forming an aperture 1320 extending from a top surface of the PCB 1300 to the core 1305. In one embodiment, a drill is used to form the aperture 1320 by drilling through all the layers above the core 1305. The aperture 1320 may be desmeared and seeded with a conductive metal.

Figure 13C:
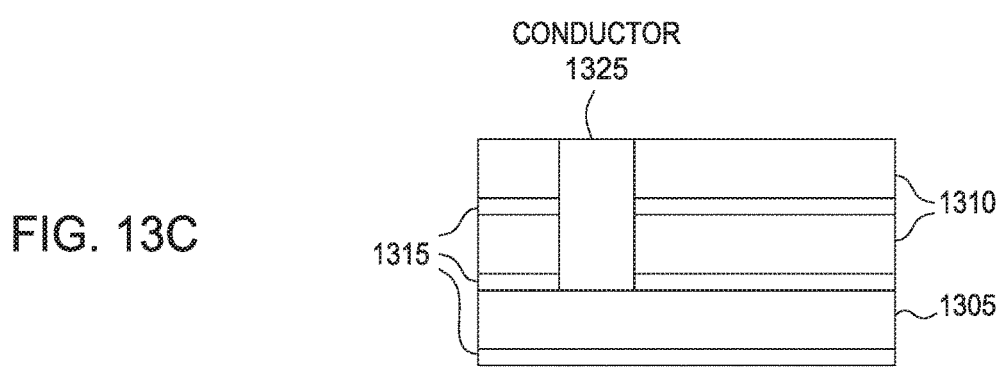

FIG. 13C illustrates filling the aperture 1320 illustrated in FIG. 13B with a conductor 1325. In one embodiment, electro plating or sputtering is used to deposit conductive material into the aperture 1320. For example, instead of creating a hollow-plated-through hole, the plating process can continue until the aperture 1320 is completed filled with the conductor 1325. If the aspect ratio of the aperture 1320 is too large, there may be a hollow center in the middle of the resulting conductor 1325. In one embodiment, the solid conductor 1325 is deposited sequentially using a stack up of lower aspect ratio holes (e.g., by decreasing the layer count) which completely fills the aperture 1320 with the conductor 1325. In one embodiment, the top surface may be planarized so that the conductor 1325 is level with the top dielectric layer 1310.

Figure 13D:
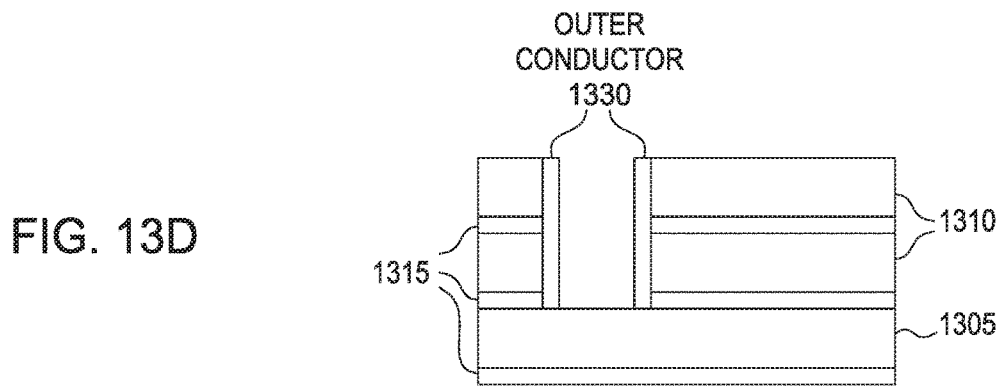

FIG. 13D illustrates removing a portion of the conductor 1325 in FIG. 13C to form an outer conductor 1330 of a coaxial via. In one embodiment, a drill is used to remove the center portion of the conductor 1325 and leave only an outer, cylindrical portion of the conductor 1325 to form the outer conductor 1330. In one embodiment, the diameter of the bit used to remove the center portion of the conductor 1325 is selected to leave approximately a 25 micron annular ring for the outer conductor 1330.

Figure 13E:
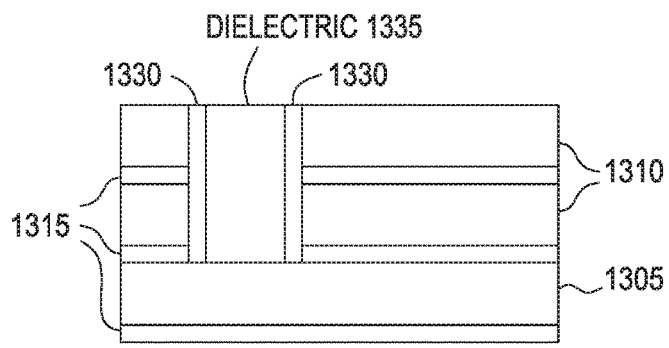

FIG. 13E illustrates depositing a dielectric 1335 into the aperture formed by the outer conductor 1330. As shown later, the dielectric 1335 insulates the outer conductor 1330 from a center conductor of the coaxial via.

Figure 13F:
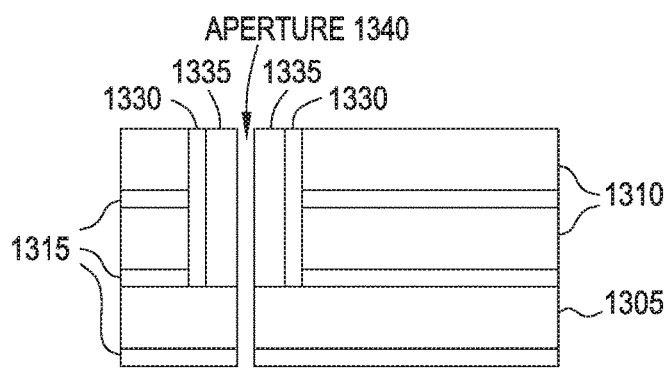

FIG. 13F illustrates removing a center portion of the dielectric 1335 using a drill or other means to form an aperture 1340 that extends from the top surface to the bottom surface of the PCB 1300 illustrated in FIG. 13A. In one embodiment, the dielectric 1335 is cured before being drilled to form the aperture 1340 using, for example, a 0.25 mm drill bit.

Figure 13G:
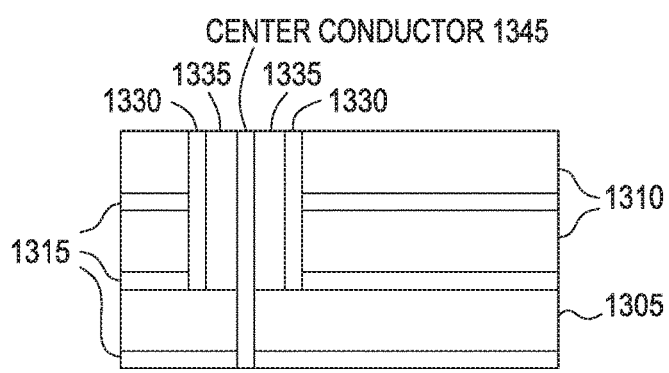

FIG. 13G illustrates filling the aperture 1340 illustrated in FIG. 13F with a conductive material to form a center conductor 1345 for the coaxial via. The same process used to form the conductor 1325 in FIG. 13C can be used here where the aperture 1340 is desmeared, seeded, and then plated to form the solid cylindrical shape of the center conductor 1345. In one embodiment, the outer conductor 1330 and the center conductor 1345 are formed from copper, but can include any conductive element compatible with the described process.

Figure 13H:
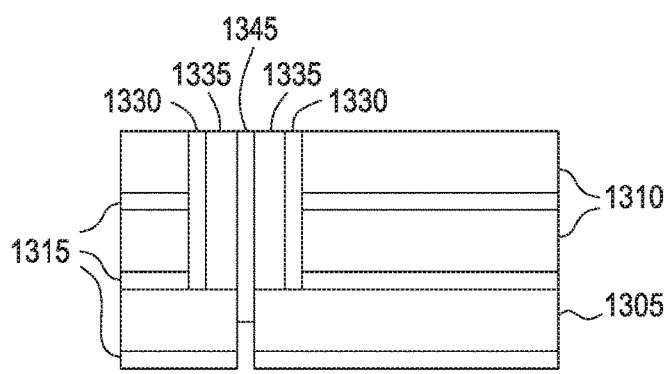

FIG. 13H illustrates removing the bottom portion of the center conductor 1345 such that the center conductor 1345 is recessed from the bottom surface of the PCB 1300 illustrated in FIG. 13A. That is, instead of the center conductor 1345 extending through the core 1305, the center conductor 1345 extends only partially through the core 1305. For example, a drill bit or a laser can be used to remove some of the center conductor 1345 so that the conductive material extends only partially through the core 1305. In one embodiment, recessing the bottom portion of the center conductor 1345 improves the ability of the conductor 1345 to radiate electromagnetic signals into the core 1305 when functioning as a monopole antenna as described above. Although not shown, in one embodiment, the aperture formed by recessing the center conductor 1345 can be backfilled with a dielectric material.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the preceding, reference is made to embodiments presented in this disclosure. However, the scope of the present disclosure is not limited to specific described embodiments. Instead, any combination of the features and elements described herein, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages described herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

While the foregoing is directed to embodiments of the present invention, other and further embodiments of the invention may be devised without departing from the basic scope thereof, and the scope thereof is determined by the claims that follow.

What is claimed is:

1. A multi-layer printed circuit board (PCB), comprising:
a dielectric waveguide comprising a core and a cladding, wherein the cladding is disposed on at least two sides of the core, and wherein a material of the core has a higher dielectric constant than a material of the cladding;
a first coaxial via comprising a first center conductor and a first outer conductor surrounding the first center conductor, wherein the first center conductor extends at least partially into a first end of the core;
a second coaxial via comprising a second center conductor and a second outer conductor surrounding the second center conductor, wherein the second center conductor extends at least partially into a second end of the core; and
a plurality of dielectric layers each separated by respective conductive ground planes, wherein the plurality of dielectric layers and the ground planes are disposed on a first side of the dielectric waveguide.

2. The PCB of claim 1, further comprising:
a pair of conductive ground planes, wherein the core and cladding are sandwiched between the pair of conductive ground planes, and wherein the core and cladding directly contact both ground planes in the pair of conductive ground planes.

3. The PCB of claim 1, wherein the first and second coaxial vias extend through the plurality of dielectric layers and the ground planes, wherein the first and second outer conductors are electrically coupled to the ground planes and the first and second center conductors are electrically insulated from the ground planes.

4. The PCB of claim 3, wherein the first and second outer conductors do not extend into the core or into the cladding of the dielectric waveguide.

5. The PCB of claim 1, wherein the first and second center conductors do not extend all the way through the core of the dielectric waveguide.

6. The PCB of claim 1, further comprising:
a first plurality of ground vias arranged around a circumference of the first outer conductor to direct electromagnetic signals radiated by the first coaxial via in a direction along the core towards the second coaxial via.

7. The PCB of claim 6, further comprising:
a second plurality of ground vias forming a horn shape that flares out from the first center conductor to the second center conductor along an axis extending between the first and second center conductors.

8. A communication system, comprising:
a dielectric waveguide comprising a core and a cladding, wherein the cladding is disposed on at least two sides of the core, and wherein a material of the core has a higher dielectric constant than a material of the cladding;
a first coaxial via comprising a first center conductor and a first outer conductor surrounding the first center conductor, wherein the first center conductor extends at least partially into a first end of the core;
a second coaxial via comprising a second center conductor and a second outer conductor surrounding the second center conductor, wherein the second center conductor extends at least partially into a second end of the core; and
a pair of conductive ground planes, wherein the core and cladding are sandwiched between the pair of conductive ground planes, wherein the core and cladding directly contact both ground planes in the pair of conductive ground planes,
wherein the first and second center conductors do not extend all the way through the core of the dielectric waveguide.

9. The communication system of claim 8, further comprising:
a first plurality of ground vias arranged around a circumference of the first outer conductor to direct electromagnetic signals radiated by the first coaxial via in a direction along the core towards the second coaxial via.

10. The communication system of claim 9, further comprising:

a second plurality of ground vias forming a horn shape that flares out from the first center conductor to the second center conductor along an axis extending between the first and second center conductors.

11. The communication system of claim 8, wherein the first and second center conductors and the first and second outer conductors extend through at least one of the pair of conductive ground planes.

12. The communication system of claim 11, wherein the first and second outer conductors do not extend into the core or into the cladding of the dielectric waveguide.

13. A method of fabricating a PCB, comprising:
   forming a dielectric waveguide comprising a core and a cladding, wherein the cladding is disposed on at least two sides of the core, and wherein a material of the core has a higher dielectric constant than a material of the cladding, wherein forming the dielectric waveguide comprises:
      depositing the cladding onto a first conductor,
      removing a portion of the cladding,
      depositing the core into the removed portion of the cladding,
      planarizing a top surface of the cladding and core, and
      depositing a second conductor onto the planarized top surface;
   forming a first coaxial via comprising a first center conductor and a first outer conductor surrounding the first center conductor, wherein the first center conductor extends at least partially into a first end of the core; and
   forming a second coaxial via comprising a second center conductor and a second outer conductor surrounding the second center conductor, wherein the second center conductor extends at least partially into a second end of the core.

14. The method of claim 13, wherein forming the first coaxial via comprises:
   forming a first aperture through at least one dielectric layer and at least one ground plane in the PCB, wherein the aperture extends to the core;
   disposing a first conductive material into the aperture; and
   removing a center portion of the first conductive material thereby forming the first outer conductor.

15. The method of claim 14, wherein forming the first coaxial via comprises:
   disposing a dielectric material into the removed center portion of the first conductive material;
   forming a second aperture through a center portion of the dielectric material, the second aperture extending through the at least one dielectric layer, the at least one ground plane, and the core;
   disposing a second conductive material into the second aperture, thereby forming the first center conductor.

16. The method of claim 15, wherein forming the first coaxial via comprises:
   removing a portion of the second conductive material in the core such that the first center conductor does not extend all the way through the core.

* * * * *